United States Patent [19]
Corsi et al.

[11] Patent Number: 5,942,941
[45] Date of Patent: Aug. 24, 1999

[54] BASE-CURRENT COMPENSATION CIRCUIT TO REDUCE INPUT OFFSET VOLTAGE IN A BIPOLAR OPERATIONAL AMPLIFIER

[75] Inventors: Marco Corsi, Dallas; Stephen W. Milam, Carrollton, both of Tex.

[73] Assignee: Texas Instruments Incorporated, Dallas, Tex.

[21] Appl. No.: 09/098,852

[22] Filed: Jun. 17, 1998

Related U.S. Application Data

[60] Provisional application No. 60/049,811, Jun. 17, 1997.

[51] Int. Cl.[6] ................................................. H03F 3/45
[52] U.S. Cl. ........................................ 330/255; 330/267
[58] Field of Search .................................. 330/255, 263, 330/267, 268

[56] References Cited

U.S. PATENT DOCUMENTS

| | | | |
|---|---|---|---|
| 4,041,407 | 8/1977 | Main | 330/13 |
| 5,389,894 | 2/1995 | Ryat | 330/255 |
| 5,512,859 | 4/1996 | Moraveji | 330/267 |

*Primary Examiner*—Robert Pascal
*Assistant Examiner*—Henry Choe
*Attorney, Agent, or Firm*—Alan K. Stewart; Wade James Brady, III; Richard L. Donaldson

[57] ABSTRACT

A bipolar operational amplifier circuit includes: a differential pair having a first transistor $Q_1$ and a second transistor $Q_2$; a third transistor $Q_6$ having a first node coupled to a first node of the first transistor $Q_1$; a fourth transistor $Q_9$ having a first node coupled to a first node of the second transistor $Q_2$; a fifth transistor $Q_8$ having a first node coupled to the first transistor $Q_1$; a sixth transistor $Q_{11}$ having a first node coupled to the second transistor $Q_2$; a current mirror 20 having a first branch coupled to a second node of the fifth transistor $Q_8$ and a second branch coupled to a second node of the sixth transistor $Q_{11}$; a seventh transistor $Q_{27}$ having a base coupled to the first branch of the current mirror 20; an eighth transistor $Q_{28}$ having a base coupled to the third transistor $Q_6$; a ninth transistor $Q_{20}$ having a first node coupled to a first node of the seventh transistor $Q_{27}$ and a base coupled to the sixth transistor $Q_{11}$; and a tenth transistor $Q_{18}$ having a first node coupled to a first node of the eighth transistor $Q_{28}$ and a base coupled to the sixth transistor $Q_{11}$.

9 Claims, 1 Drawing Sheet

BASE-CURRENT COMPENSATION CIRCUIT TO REDUCE INPUT OFFSET VOLTAGE IN A BIPOLAR OPERATIONAL AMPLIFIER

This application claims priority under 35 USC § 119 (e) (1) of provisional application No. 60/049,811, filed Jun. 17, 1997.

FIELD OF THE INVENTION

This invention generally relates to electronic systems and in particular it relates to operational amplifiers.

BACKGROUND OF THE INVENTION

Shown in FIG. 1 is a prior art operational amplifier. Systematic offset voltage results when there is a mismatch ($\Delta I$) between the currents flowing in the collectors of the two input transistors, $Q_1$ and $Q_2$ (differential pair). The difference between these currents is divided by the transconductance ($g_m$) of the input stage and the result is the systematic input offset voltage.

$V_{IO} = \Delta I / g_m$

The majority of the mismatch between the collector currents of transistors $Q_1$ and $Q_2$ is due to the mismatch in transistors $Q_{18}$ and $Q_{20}$. Since the bases of transistors $Q_{18}$ and $Q_{20}$ are connected to the same node, any difference in the magnitudes of their base currents results in an error current which flows into that node at the collectors of transistors $Q_{11}$ and $Q_{15}$. This error current causes a mismatch between the collector currents of transistors $Q_{11}$ and $Q_{15}$. The current mirror 20 composed of transistors $Q_{12}$, $Q_{13}$, $Q_{15}$, and $Q_{16}$ causes the collector currents of transistors $Q_{15}$ and $Q_8$ to be equal. The collector currents of transistors $Q_1$ and $Q_2$ are related to those of transistors $Q_8$ and $Q_{11}$ as follows:

$I_{C1} = I_{C6} - I_{C8}$  $I_{C2} = I_{C9} - I_{C11}$ (Where $I_{CN}$ is the collector current of transistor $Q_N$)

Since $I_{C6}$ and $I_{C9}$ are equal (due to the biasing circuit), $I_{C6} = I_{C9} = I_{C1} + I_{C8} = I_{C2} + I_{C11}$ $\Delta I = I_{C1} - I_{C2} = I_{C11} - I_{C8}$ Therefore, any mismatch in the base currents of transistors $Q_{18}$ and $Q_{20}$ translates into input collector current mismatch and thus input offset voltage.

There are at least two reasons that the base currents in transistors $Q_{18}$ and $Q_{20}$ might not be equal. Since the transistors are different types (NPN and PNP), their $\beta$'s (ratio of collector to base current) will probably be different. Even if the bias currents provided by transistors $Q_{19}$ and $Q_{21}$ to $Q_{18}$ and $Q_{20}$, respectively, are equal, the base currents, $I_{B18}$ and $I_{B20}$, will be different if the $\beta$'s are different. Thus the base currents will be mismatched unless the $\beta$'s are mismatched by exactly the opposite ratio of the bias current mismatch (which is highly unlikely, and will change with temperature).

SUMMARY OF THE INVENTION

Generally, and in one form of the invention, a bipolar operational amplifier circuit includes: a differential pair having a first transistor and a second transistor; a third transistor having a first node coupled to a first node of the first transistor; a fourth transistor having a first node coupled to a first node of the second transistor; a fifth transistor having a first node coupled to the first transistor; a sixth transistor having a first node coupled to the second transistor; a current mirror having a first branch coupled to a second node of the fifth transistor and a second branch coupled to a second node of the sixth transistor; a seventh transistor having a base coupled to the first branch of the current mirror; an eighth transistor having a base coupled to the third transistor; a ninth transistor having a first node coupled to a first node of the seventh transistor and a base coupled to the sixth transistor; and a tenth transistor having a first node coupled to a first node of the eighth transistor and a base coupled to the sixth transistor.

DETAILED DESCRIPTION OF PREFERRED EMBODIMENTS

Figure 1:
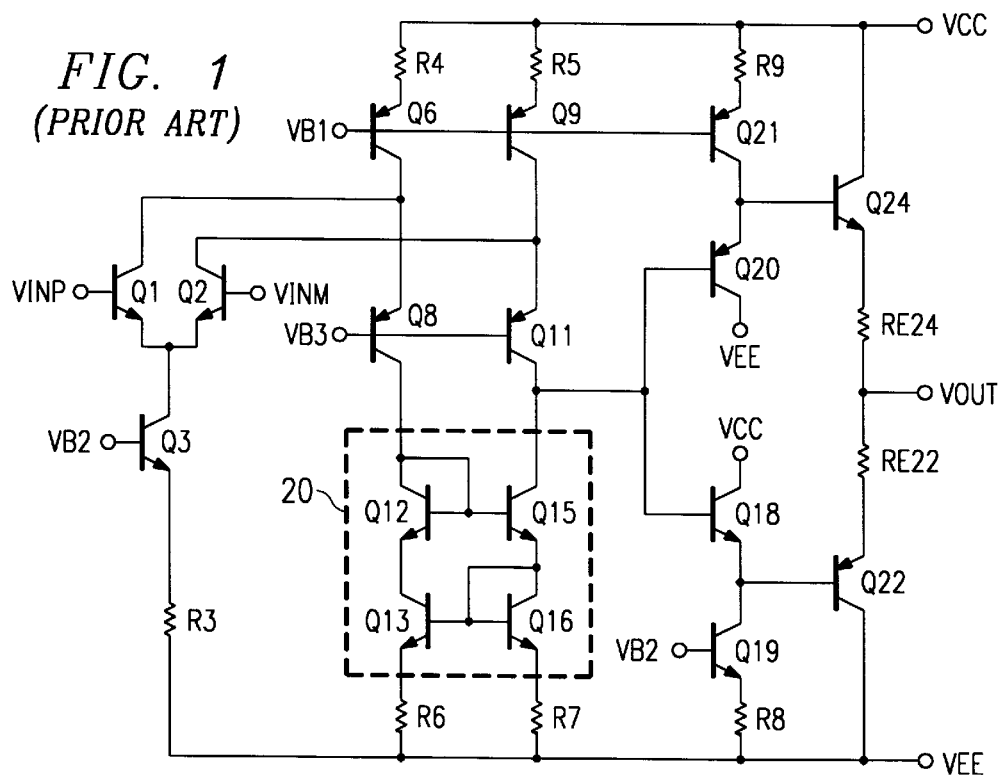
FIG. 1 is a schematic circuit diagram of a prior art operational amplifier.
Figure 2:
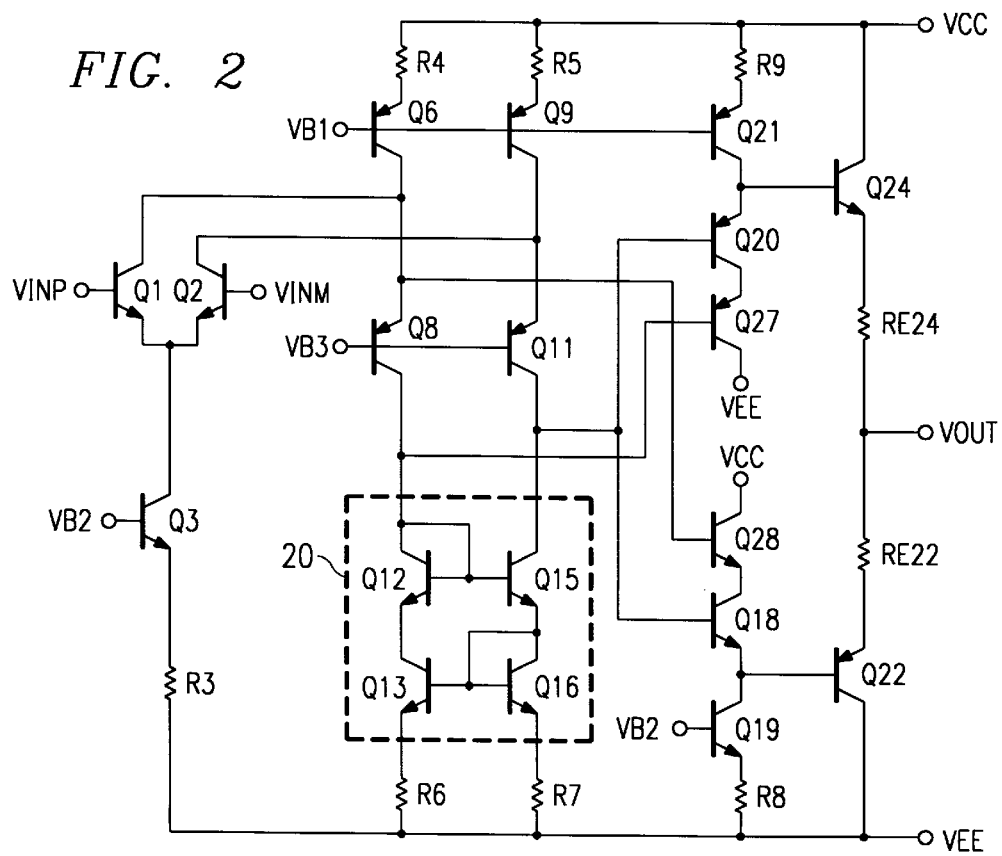
FIG. 2 is a schematic circuit diagram of a preferred embodiment operational amplifier with base current compensation.

The prior art operational amplifier of FIG. 1 includes NPN transistors $Q_1$, $Q_2$, $Q_3$, $Q_{12}$, $Q_{13}$, $Q_{15}$, $Q_{16}$, $Q_{18}$, $Q_{19}$, and $Q_{24}$; PNP transistors $Q_6$, $Q_8$, $Q_9$, $Q_{11}$, $Q_{20}$, $Q_{21}$, and $Q_{22}$; resistors $R_3$, $R_4$, $R_5$, $R_6$, $R_7$, $R_8$, $R_9$, $RE_{22}$, and $RE_{24}$; input voltages $V_{INP}$ and $V_{INM}$; bias voltages $V_{B1}$, $V_{B2}$, and $V_{B3}$; supply voltages $V_{CC}$ and $V_{EE}$; and output voltage $V_{OUT}$. Transistors $Q_{12}$, $Q_{13}$, $Q_{15}$, and $Q_{16}$ form current mirror 20. Transistors $Q_{12}$ and $Q_{13}$ form one branch of current mirror 20, and transistors $Q_{15}$ and $Q_{16}$ form another branch of current mirror 20. FIG. 2 is a circuit schematic illustrating a preferred embodiment operational amplifier with base current compensation. The circuit of FIG. 2 includes all the elements of the prior art device of FIG. 1 with the addition of transistors $Q_{27}$ and $Q_{28}$.

The collector current of transistor $Q_{18}$ flows into transistor $Q_{28}$, which is the same type of transistor (NPN) as transistor $Q_{18}$, and so their $\beta$'s are likely to be well matched. The base currents of transistors $Q_{18}$ and $Q_{28}$ are well matched because both reasons for mismatch mentioned above are eliminated. The base currents of transistors $Q_{20}$ and $Q_{27}$ should be well matched for the same reasons. To understand how these components compensate for base current mismatches, first assume there is no base current in transistor $Q_{18}$ or $Q_{28}$ (assume they have infinite $\beta$). If the base current flowing from transistor $Q_{20}$ is $I_{ERROR}$, then the current flowing in the collector of transistor $Q_{15}$ is $I_{C11} + I_{ERROR}$. The current mirror 20 causes the same current to flow in the collector of transistor $Q_{12}$. Since $I_{ERROR}$ also flows from the base of transistor $Q_{27}$ into transistor $Q_{12}$, the remaining current $I_{C11}$ flows in the collector of transistor $Q_8$. Thus the currents in transistors $Q_8$ and $Q_{11}$ match, and, since the currents in transistors $Q_6$ and $Q_9$ match, the currents in transistors $Q_1$ and $Q_2$ will match.

Now assume that transistors $Q_{20}$ and $Q_{27}$ have infinite $\beta$ and thus no base current to cause errors, and the current flowing into the base of transistor $Q_{18}$ is $I_{ERROR}$. The collector current of transistor $Q_{15}$ (and thus transistor $Q_{12}$ by mirroring action) is now $I_{C11} - I_{ERROR}$, which will also be the collector current of transistor $Q_8$. Summing the currents at the collector of transistor $Q_1$:

$I_{C1} = I_{C6} - I_{ERROR} - I_{C8}$ $= I_{C6} - I_{ERROR} - (I_{C11} - I_{ERROR})$ $= I_{C6} - I_{C11}$ $= I_{C9} - I_{C11}$ $= I_{C2}$

Thus the base current errors of transistors $Q_{18}$ and $Q_{20}$ are compensated by this circuit, and the systematic input offset voltage is reduced.

Alternative versions of the preferred embodiment include many variations in the way the bases of transistors $Q_{27}$ and $Q_{28}$ are connected. These variations change the point in the circuit at which the compensating base currents are injected, but the analysis of the compensation is analogous to that described above. The base of transistor $Q_{27}$ may be connected to the emitter of transistor $Q_{12}$ or to the emitter of transistor $Q_{13}$. The base of transistor $Q_{28}$ may be connected to the emitter instead of the collector of transistor $Q_{6}$.

Although the present invention has been described in detail, it should be understood that various changes, substitutions and alterations can be made without departing from the spirit and scope of the invention as defined by the appended claims. It is therefore intended that the appended claims encompass any such modifications or embodiments.

What is claimed is:

1. A bipolar operational amplifier circuit comprising:
   a differential pair having a first transistor and a second transistor;
   a third transistor having a first node coupled to a first node of the first transistor;
   a fourth transistor having a first node coupled to a first node of the second transistor;
   a fifth transistor having a first node coupled to the first transistor;
   a sixth transistor having a first node coupled to the second transistor;
   a current mirror having a first branch coupled to a second node of the fifth transistor and a second branch coupled to a second node of the sixth transistor;
   a seventh transistor having a base coupled to the first branch of the current mirror;
   an eighth transistor having a base coupled to the third transistor;
   a ninth transistor having a first node coupled to a first node of the seventh transistor and a base coupled to the sixth transistor; and
   a tenth transistor having a first node coupled to a first node of the eighth transistor and a base coupled to the sixth transistor.

2. The circuit of claim 1 further comprising an eleventh transistor coupled to a second node of the first transistor and to a second node of the second transistor.

3. The circuit of claim 1 further comprising:
   an eleventh transistor having a base coupled to a second node of the ninth transistor; and
   a twelfth transistor having a base coupled to a second node of the tenth transistor.

4. The circuit of claim 3 further comprising an output node coupled between the eleventh and twelfth transistors.

5. The circuit of claim 1 further comprising:
   an eleventh transistor coupled to a second node of the ninth transistor; and
   a twelfth transistor coupled to a second node of the tenth transistor.

6. The circuit of claim 5 wherein a base of the eleventh transistor is coupled to a base of the third transistor.

7. The circuit of claim 1 wherein the current mirror comprises:
   a first mirror transistor;
   a second mirror transistor coupled to the first mirror transistor to form the first branch of the current mirror;
   a third mirror transistor having a base coupled to a base of the first mirror transistor; and
   a fourth mirror transistor coupled to the third mirror transistor to form the second branch of the current mirror, the fourth mirror transistor having a base coupled to a base of the second mirror transistor.

8. The circuit of claim 1 wherein a base of the third transistor is coupled to a base of the fourth transistor.

9. The circuit of claim 1 wherein a base of the fifth transistor is coupled to a base of the sixth transistor.

* * * * *